(12) United States Patent
Korenaga

(10) Patent No.: US 8,834,769 B2
(45) Date of Patent: Sep. 16, 2014

(54) IMPRINT APPARATUS FOR FORMING A PATTERN OF A RESIN ON A SUBSTRATE USING A MOLD

(75) Inventor: Nobushige Korenaga, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 553 days.

(21) Appl. No.: 12/902,552

(22) Filed: Oct. 12, 2010

(65) Prior Publication Data

US 2011/0084423 A1  Apr. 14, 2011

(30) Foreign Application Priority Data

Oct. 14, 2009  (JP) .................................. 2009-237581

(51) Int. Cl.
*G03F 7/00* (2006.01)
*H01L 21/67* (2006.01)
*B82Y 40/00* (2011.01)
*B82Y 10/00* (2011.01)

(52) U.S. Cl.
CPC .... *H01L 21/67121* (2013.01); *H01L 21/67092* (2013.01); *B82Y 40/00* (2013.01); *G03F 7/0002* (2013.01); *B82Y 10/00* (2013.01); *Y10S 977/887* (2013.01)
USPC ........... 264/293; 425/406; 425/385; 264/319; 977/887

(58) Field of Classification Search
None
See application file for complete search history.

(56) References Cited

U.S. PATENT DOCUMENTS 7,381,272 B2 * 6/2008 Kasumi et al. ................ 118/500
2005/0212156 A1  9/2005 Tokita et al.

FOREIGN PATENT DOCUMENTS

JP  2005-286062 A  10/2005

OTHER PUBLICATIONS

Trabadelo et al. Measurement of demolding forces in full wafer thermal nanoimprint, Microelectronic Engineering vol. 85, Issues 5-6, Feb. 7, 2008, pp. 907-909.*

* cited by examiner

*Primary Examiner* — Benjamin Schiffman
(74) *Attorney, Agent, or Firm* — Rossi, Kimms & McDowell LLP

(57) ABSTRACT

The present invention provides an imprint apparatus including a mold and a stage that holds a substrate, the imprint apparatus executing a curing process of curing a resin while the mold and the resin applied to the substrate contact and a demolding process of releasing the mold from the resin cured in the curing process, the imprint apparatus including a structure that holds the mold, a pillar that supports the structure mechanically independently from the stage through an anti-vibration mount that reduces propagation of vibration, and a force providing unit that provides, to the structure, force in an opposite direction from a direction of force generated in the structure by providing demolding force to the mold during the demolding process.

6 Claims, 2 Drawing Sheets

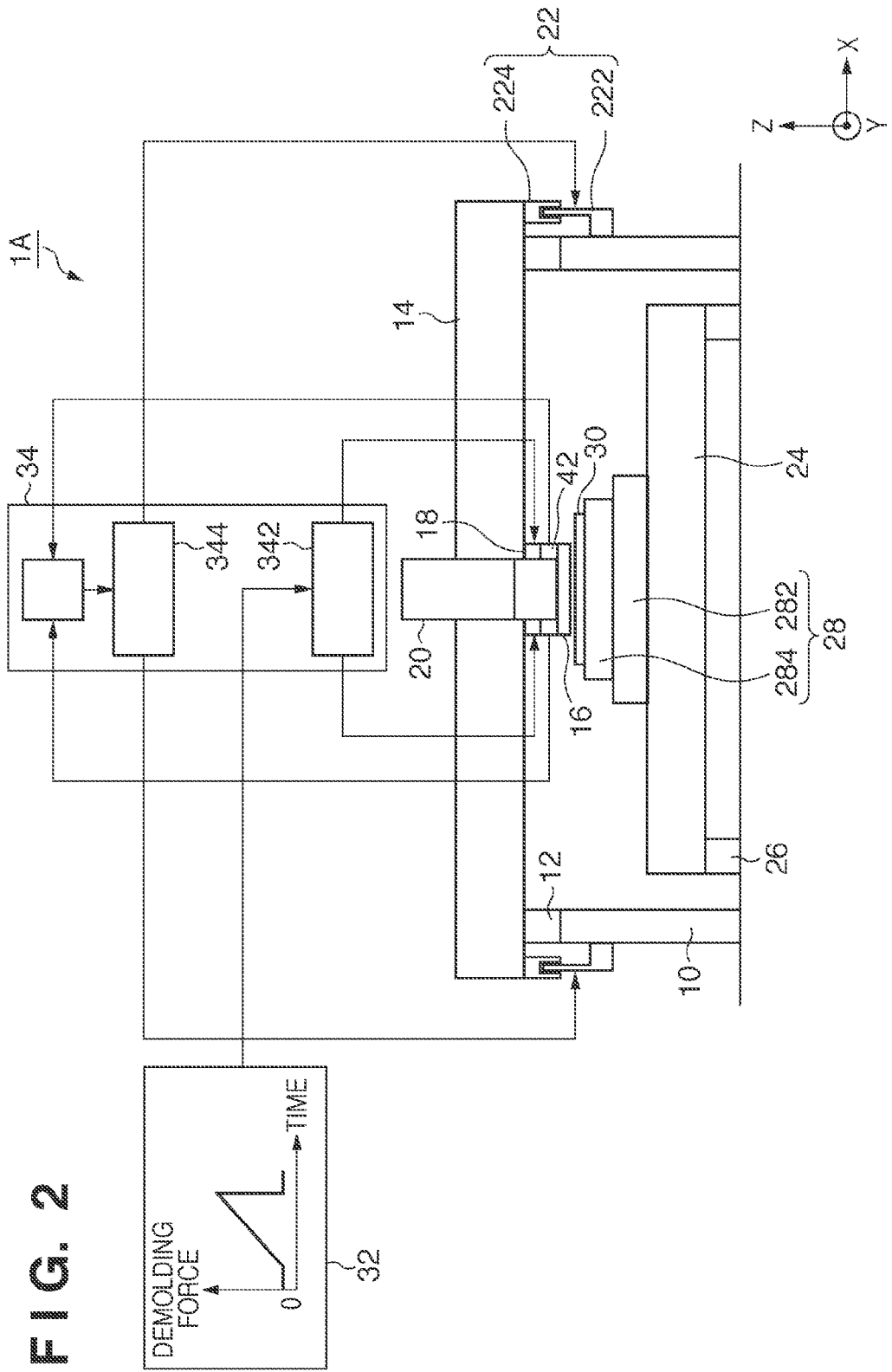

2

IMPRINT APPARATUS FOR FORMING A PATTERN OF A RESIN ON A SUBSTRATE USING A MOLD

BACKGROUND OF THE INVENTION

1. Field of the Invention

The present invention relates to an imprint apparatus and a manufacturing method of commodities.

2. Description of the Related Art

In recent years, an imprint technique that allows formation of a fine pattern is drawing attention as a technique for manufacturing a semiconductor device. In the imprint technique, a resin is applied to a substrate, such as a silicon wafer and a glass plate, and the resin is cured while an original plate (mold) with a fine pattern is pressed against the substrate through the resin to form the fine pattern on the substrate. Examples of the curing method of the resin include a light curing method where ultraviolet light is directed to an ultraviolet curing resin and a heat curing method where heat is applied to a heat curing resin.

An imprint apparatus using such an imprint technique is disclosed in Japanese Patent Laid-Open No. 2005-286062. A wafer stage for driving a wafer is arranged on a base in the imprint apparatus, and a mold and a mold driving unit that drives the mold are arranged on a structure frame combined with the base. The base and the structure frame are united and supported by an anti-vibration mount.

In the manufacturing of the semiconductor device, the next pattern needs to be accurately positioned (overlaid) and formed relative to the pattern formed on the substrate. To improve the productivity, the substrate needs to be positioned while the wafer stage is quickly driven, the mold needs to be imprinted, the resin needs to be cured, and the mold needs to be released (demolded) from the resin.

However, in the imprint apparatus disclosed in Japanese Patent Laid-Open No. 2005-286062, reactive force caused by the drive of the wafer stage is propagated to the structure frame through the base, and the structure frame is vibrated. The vibration of the structure frame causes relative vibration of the wafer and the mold, and overlay accuracy of the pattern formed on the substrate is degraded.

The structure frame and the base (wafer stage) can be mechanically independently supported by the anti-vibration mount to control the vibration of the structure frame caused by the drive of the stage (that is caused by the reactive force). However, as demolding force is provided to the mold during demolding, force generated in the structure is propagated to the anti-vibration mount with low supporting rigidity. Therefore, the entire structure frame including the mold is displaced, following the wafer. As a result, excellent demolding cannot be performed.

SUMMARY OF THE INVENTION

The present invention provides a technique for preventing degradation of overlay accuracy of a pattern caused by the drive of a stage and capable of executing an excellent demolding process.

According to one aspect of the present invention, there is provided an imprint apparatus comprising a mold and a stage that holds a substrate, the imprint apparatus executing a curing process of curing a resin while the mold and the resin applied to the substrate contact and a demolding process of releasing the mold from the resin cured in the curing process, the imprint apparatus including a structure that holds the mold, a pillar that supports the structure mechanically independently from the stage through an anti-vibration mount that reduces propagation of vibration, and a force providing unit that provides, to the structure, force in an opposite direction from a direction of force generated in the structure by providing demolding force to the mold during the demolding process.

Further aspects of the present invention will become apparent from the following description of exemplary embodiments with reference to the attached drawings.

BRIEF DESCRIPTION OF THE DRAWINGS

FIG. 2 is a diagram showing another configuration of the imprint apparatus as an aspect of the present invention.

DESCRIPTION OF THE EMBODIMENTS

Figure 1:
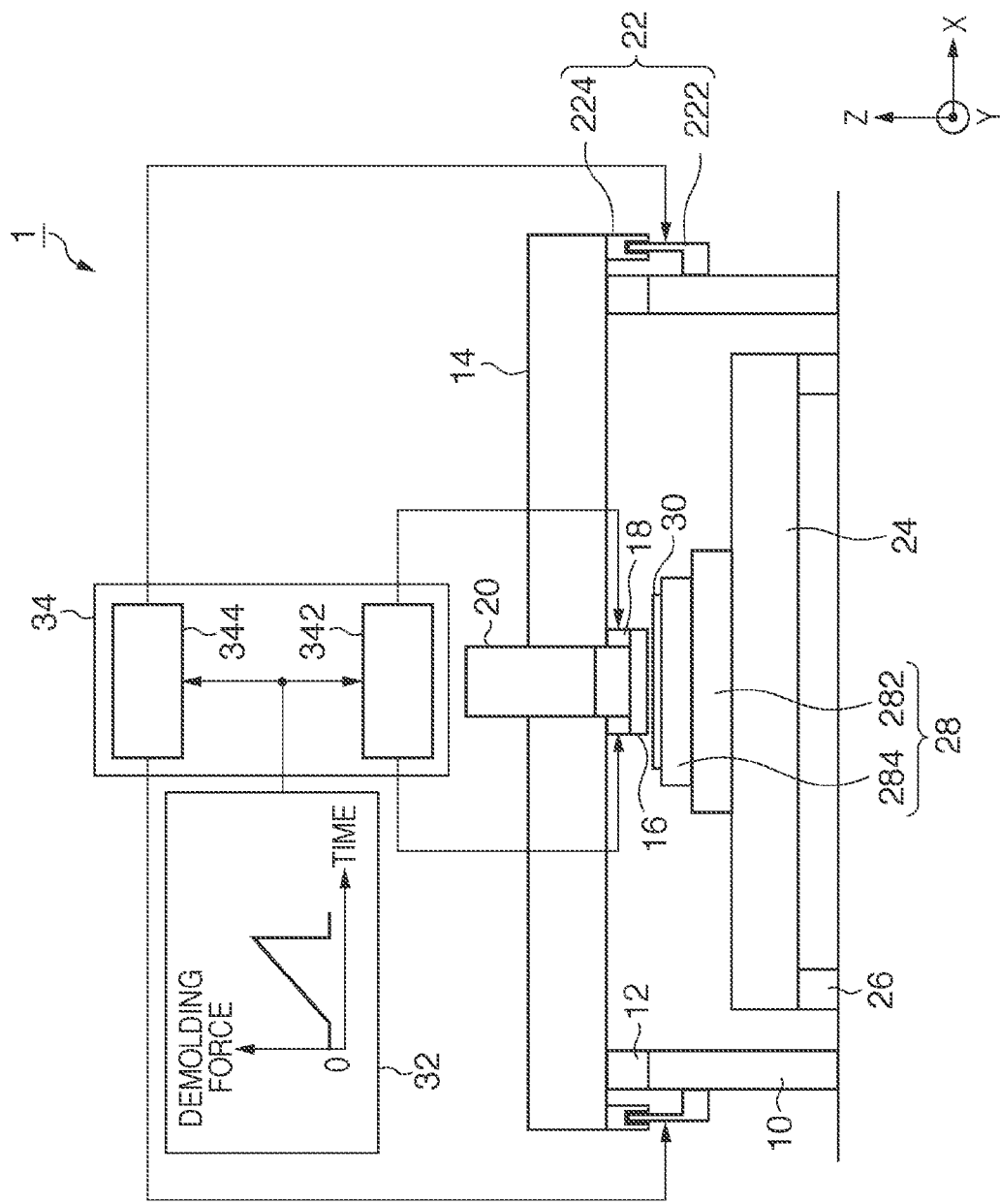
FIG. 1 is a diagram showing a configuration of an imprint apparatus as an aspect of the present invention.

Preferred embodiments of the present invention will be described below with reference to the accompanying drawings. Note that the same reference numerals denote the same members throughout the drawings, and a repetitive description thereof will not be given.

First Embodiment

FIG. 1 is a diagram showing a configuration of an imprint apparatus 1 as an aspect of the present invention. The imprint apparatus 1 executes an imprint process, a curing process, and a demolding process (that is uses an imprint technique) to form a pattern on a substrate. The imprint process is a process of applying a resin on the substrate and pressing a mold (original plate) including a pattern against the substrate through the resin. The curing process is a process of curing the resin while the mold is being pressed against the substrate applied with the resin. The demolding process is a process of releasing the mold from the resin cured in the curing process.

As shown in FIG. 1, the imprint apparatus 1 includes a pillar 10, an anti-vibration mount 12, a structure 14, a mold 16, a mold driving unit 18, an illumination system 20, and a force providing unit 22. The imprint apparatus 1 further includes a stage base 24, an anti-vibration mount 26, a wafer stage 28, a profile generation unit 32, and a control unit 34.

The pillar 10 supports the structure 14 mechanically independently from the stage base 24 (wafer stage 28), through the anti-vibration mount 12 that reduces (insulates) the propagation of vibration from an installation surface (floor). The structure 14 holds the mold 16 with a fine pattern through the mold driving unit 18, the mold 16 being an original plate based on the imprint technique. The mold driving unit 18 has a function of driving the mold 16. Although the mold driving unit 18 is constituted by a piezo actuator in the present embodiment, another well known actuator may constitute the mold driving unit 18. The illumination system 20 is arranged on the structure 14 and directs light for curing the resin applied to the wafer 30. The force providing unit 22 provides, to the structure 14, force in the opposite direction (+Z direction) from a direction (−Z direction) of force generated in the structure 14 by providing demolding force (force for releasing the mold 16 from the resin) to the mold 16 during the demolding process. The force providing unit 22 is constituted by a linear motor including a coil 222 arranged on the pillar 10 and a magnet 224 arranged on the structure 14 in the present embodiment and applies a current to the coil 222 to generate force in the +Z direction between the pillar 10 and the structure 14.

As described, the stage base 24 is supported by the anti-vibration mount 26 that reduces the propagation of the vibration from the installation surface, mechanically independently from the structure 14. The wafer stage 28 including an XY stage 282 and a Z tilt stage 284 is arranged on the stage base 24. The Z tilt stage 284 holds the wafer 30 through a wafer chuck (not shown). The XY stage 282 includes several hundred mm drive strokes in an X axis direction and a Y axis direction to realize formation of patterns on all surfaces (all shots) of the wafer 30 and measurement of positions in all surfaces of the wafer 30. The Z tilt stage 284 freely tilts around a Z axis. The anti-vibration mount 26 that supports the stage base 24 is not essential. For example, the XY stage 282 may support the Z tilt stage 284 through the anti-vibration mount to reduce the propagation of the vibration from the installation surface.

The profile generation unit 32 generates a profile indicating, in chronological order, demolding force provided to the mold 16 to release the mold 16 from the cured resin. The control unit 34 controls the (entire) operation of the imprint apparatus 1. For example, the control unit 34 controls the force providing unit 22 to provide, to the structure 14, force equivalent to the force generated in the structure 14 (force in the opposite direction from the direction of the force generated in the structure 14) by providing demolding force to the mold 16 in the demolding process. Specific control of the control unit 34 in the demolding process will be described in detail later.

An operation of the imprint apparatus 1 will be described. A wafer transport system (not shown) transports the wafer 30, and the Z tilt stage 284 holds the wafer 30. An alignment detection system then detects the position of the pattern formed on the wafer 30, and the target position of the wafer 30 is determined shot by shot. While the wafer 30 is driven toward the target position, a dispenser (not shown) applies the resin to the shot (target shot for forming the pattern of the mold 16) of the wafer 30. When the wafer 30 is positioned at the target position, the mold driving unit 18 lowers the mold 16 and imprints the mold 16 to the resin applied to the wafer (imprint process). While the mold 16 is imprinted, the illumination system 20 directs light to cure the resin (curing process). The mold driving unit 18 raises the mold 16 to release the mold 16 from the cured resin (demolding process).

In the imprint apparatus 1, as described, the structure 14 that holds the mold 16 is supported by the pillar 10 mechanically independently from the stage base 24 through the anti-vibration mount 12. Therefore, as the demolding force is provided to the mold 16 during the demolding process, the force generated in the structure 14 acts on the anti-vibration mount 12. The anti-vibration mount 12 has low rigidity to insulate the vibration from the installation surface and is displaced if the force generated in the structure 14 acts on the anti-vibration mount 12.

Therefore, in the present embodiment, a current is applied to the coil 222, and force is generated between the coil 222 and the magnet 224. Based on the force, demolding force is provided to the mold 16 to cancel the force generated in the structure 14.

Specifically, when a signal for instructing the start of the demolding process is inputted to the imprint apparatus 1, the profile generation unit 32 generates a profile indicating, in chronological order, demolding force provided to the mold 16 to release the mold 16 from the cured resin. The profile generation unit 32 inputs the profile to the control unit 34 (first generation unit 342 and second generation unit 344).

In the control unit 34, the first generation unit 342 generates a voltage value applied to the mold driving unit 18 constituted by a piezo actuator in accordance with the profile generated by the profile generation unit 32. The second generation unit 344 generates a current value applied to the coil 222 in accordance with the profile generated by the profile generation unit 32. The control unit 34 applies a voltage with the voltage value generated by the first generation unit 342 to the mold driving unit 18 and applies a current with the current value generated by the second generation unit 344 to the coil 222. In this way, the control unit 34 determines the force provided to the structure 14 in accordance with the profile generated by the profile generation unit 32 and controls the force providing unit 22 to provide the force to the structure 14. As a result, the force generated in the structure 14 by providing the demolding force to the mold 16 during the demolding process is canceled by the force provided by the force providing unit 22 to the structure 14, and an excellent demolding process can be executed without displacement of the structure 14 (anti-vibration mount 12).

The control unit 34 independently controls the mold driving unit 18 and the force providing unit 22 based on the profile generated by the profile generation unit 32. Therefore, there is no interaction between the mold driving unit 18 and the force providing unit 22, and the control unit 34 can stably control the mold driving unit 18 and the force providing unit 22 even if the profile (FIG. 1) indicates a monotone increase and a steep change toward 0.

As described, in the imprint apparatus 1, the force generated in the structure 14 by providing the demolding force to the mold 16 during the demolding process is canceled by the force provided by the force providing unit 22 to the structure 14. Therefore, force does not act in the structure 14 as a whole. As a result, an excellent demolding process can be executed without displacement of the structure 14 during the demolding process even if the structure 14 is supported through the anti-vibration mount 12 with low rigidity. Since the structure 14 is supported mechanically independently from the stage base 24, reactive force does not propagate to the structure 14 when the wafer stage 28 is driven in high speed. Therefore, the structure 14 and the mold 16 do not vibrate, and the degradation in the overlay accuracy of the pattern formed on the wafer 30 can be prevented.

Second Embodiment

FIG. 2 is a diagram showing a configuration of an imprint apparatus 1A as an aspect of the present invention. In addition to the constituent elements of the imprint apparatus 1, the imprint apparatus 1A further includes a detection unit 42 that detects demolding force provided to the mold 16. In the imprint apparatus 1A, in addition to the first generation unit 342 and the second generation unit 344, the control unit 34 includes a profile conversion unit 346. The profile conversion unit 346 converts the detection result of the detection unit 42 to a profile equivalent to the profile generated by the profile generation unit 32 (that is profile indicating the demolding force detected by the detection unit 42 in chronological order). The point that the structure 14 is supported by the pillar 10 mechanically independently from the stage base 24 through the anti-vibration mount 12 and the point that force providing unit 22 generates force in the +Z direction between the pillar 10 and the structure 14 are the same as in the imprint apparatus 1.

In the imprint apparatus 1A, the profile generated by the profile generation unit 32 is inputted only to the first generation unit 342. In accordance with the profile generated by the profile generation unit 32, the first generation unit 342 generates a voltage value applied to the mold driving unit 18 constituted by a piezo actuator. The control unit 34 then applies a voltage with the voltage value generated by the first generation unit 342 to the mold driving unit 18 to drive the mold 16. As a result, the detection unit 42 detects demolding force provided to the mold 16. The profile conversion unit 346 converts the detection result of the detection unit 42 to a profile indicating, in chronological order, the demolding force detected by the detection unit 42. The second generation unit 344 generates a current value applied to the coil 222 according to the profile converted by the profile conversion unit 346. The control unit 34 then applies a current with the current value generated by the second generation unit 344 to the coil 222. In this way, the control unit 34 controls the force providing unit 22 to provide, to the structure 14, force equivalent to the force generated in the structure 14 according to the demolding force detected by the detection unit 42 (force in the opposite direction from the direction of the force generated in the structure 14). As a result, the force generated in the structure 14 by providing the demolding force to the mold 16 during the demolding process is canceled by the force provided by the force providing unit 22 to the structure 14, and an excellent demolding process can be executed without displacement of the structure 14 (anti-vibration mount 12).

In the imprint apparatus 1A, the force provided by the force providing unit 22 to the structure 14 follows the demolding force detected by the detection unit 42. Therefore, even if demolding force different from the profile generated by the profile generation unit 32 is provided to the mold 16, the force generated in the structure 14 can be canceled by providing the demolding force. For example, if the resin applied to the wafer 30 is changed, the profile generated by the profile generation unit 32 also needs to be changed in general. However, in the imprint apparatus 1A, the force generated in the structure 14 can be canceled by providing the demolding force to the mold 16 without changing the profile generated by the profile generation unit 32.

Although the profile generated by the profile generation unit 32 is inputted to the first generation unit 342 in the present embodiment, the profile generated by the profile generation unit 32 may be inputted to the second generation unit 344. In that case, the force provided by the force providing unit 22 to the structure 14 is detected, the detection result is inputted to the first generation unit 342, and the voltage value applied to the mold driving unit 18 is generated. The force provided by the force providing unit 22 to the structure 14 is proportional to the current value of the current applied to the coil 222. Therefore, the current value of the current applied to the coil 222 may be detected instead of directly detecting the force provided to the structure 14.

Although the force providing unit 22 is constituted by a linear motor including the coil 222 and the magnet 224 in the first and the second embodiments, the force providing unit 22 can be constituted by another generally known actuator. The second generation unit 344 may be constituted by a pressure control unit to control the pressure provided to the anti-vibration mount 12 to provide force equivalent to the force generated in the structure 14 by providing the demolding force to the mold 16 (force in the opposite direction from the direction of the force generated in the structure 14.)

The imprint apparatuses 1 and 1A each includes two mold driving units 18 and two force providing units 22 in the first and second embodiments, and only the force in the Z axis direction (perpendicular direction) has been described. However, the tilt component of the force generated in the structure 14 by providing the demolding force to the mold 16 also needs to be actually cancelled by the force provided by the force providing unit 22. Therefore, the numbers and the positions of the mold driving units 18 and the force providing units 22 need to be appropriately set. Such a technique is a technique well known in the art, and details will not be described here.

Although the XY stage 282 and the Z tilt stage 284 constitute the wafer stage 28 in the first and second embodiments, only the XY stage 282 may constitute the wafer stage 28. In that case, the mold 16 (mold driving unit 18) can freely tilt around the Z axis.

The mold driving unit 18 drives the mold 16 to generate the demolding force during the demolding process in the first and second embodiments. However, instead of the mold driving unit 18, a Z axis drive mechanism on the wafer stage side (for example, Z tilt stage 284) may drive the wafer 30 to generate the demolding force. In that case, the first generation unit 342 generates a voltage value applied to the wafer stage in accordance with the profile generated by the profile generation unit 32.

The profile generated by the profile generation unit 32 may be obtained by another evaluation system or may be measured and obtained by the imprint apparatus 1 or 1A. The demolding force detected by the detection unit 42 can be stored in chronological order, and the next profile can be predicted from the past demolding force to rewrite the profile generated by the profile generation unit 32. If a peripheral part of the wafer 30 is included in an area for imprinting the mold 16, the demolding force changes. In such a case, for example, a profile database with a parameter including the length and the representative position of the peripheral part of the wafer included in the area for imprinting the mold 16 can be stored, and the profile can be switched according to the length and the representative position of the peripheral part of the wafer. Furthermore, databases of profile can be stored according to the types of the resin applied to the wafer, and the profile can be switched according to the type of the resin.

As described, according to the imprint apparatus 1 or 1A, fast drive of the wafer stage 28 is possible (that is degradation of the overlay accuracy of the pattern caused by the drive of the wafer stage 28 can be prevented), and an excellent demolding process can be executed. Therefore, the imprint apparatus 1 or 1A can provide economical and high-quality commodities in high throughput.

A manufacturing method of devices (such as a semiconductor integrated circuit element and a liquid crystal display element) as commodities includes a step of transferring (forming) a pattern on a substrate (such as a wafer, a glass plate, and a film substrate) using the imprint apparatus 1 or 1A. The manufacturing method further includes a step of etching the substrate with the transferred pattern. In place of the etching step, the manufacturing method includes another processing step of processing the substrate with the transferred pattern to manufacture other commodities, such as pattern dot media (recording media) and optical elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2009-237581 filed on Oct. 14, 2009, which is hereby incorporated by reference herein in its entirety.

What is claimed is:

1. A manufacturing method of commodities comprising:
    forming a pattern of a resin on a substrate with an imprint apparatus that holds a mold; and
    processing the substrate with the pattern, wherein the imprint apparatus comprises:
a stage that holds the substrate;
a structure that holds said mold;
a mold driving unit that moves said mold, relative to the stage, toward and away from the substrate to imprint and release the mold from the cured resin;
a first anti-vibration mount that reduces propagation of vibration;
a pillar that supports said structure mechanically independently from said stage through said first anti-vibration mount;
a stage base that supports said stage mechanically independently from said structure; and
a force providing unit that provides, to said structure, relative to the pillar, force in an opposite direction from a direction of force generated in said structure by demolding force provided to said mold by the mold driving unit during releasing of said mold after the resin has been cured.

2. An imprint apparatus for forming a pattern of a resin on a substrate using a mold, the imprint apparatus comprising:
a stage that holds the substrate;
a structure that holds said mold;
a mold driving unit that moves said mold, relative to the stage, toward and away from the substrate to imprint and release the mold from the cured resin;
a first anti-vibration mount that reduces propagation of vibration;
a pillar that supports said structure mechanically independently from said stage through said first anti-vibration mount;
a stage base that supports said stage mechanically independently from said structure; and
a force providing unit that provides, to said structure, relative to the pillar, force in an opposite direction from a direction of force generated in said structure by demolding force provided to said mold by the mold driving unit during releasing of said mold after the resin has been cured.

3. The imprint apparatus according to claim 2, further comprising a control unit that controls said force providing unit to provide, to said structure, force in the opposite direction equivalent to the force generated in said structure.

4. The imprint apparatus according to claim 3, further comprising:
a profile generation unit that generates a profile indicating, in chronological order, the demolding force provided to said mold; and
a mold driving unit that drives said mold,
wherein said control unit determines the demolding force provided to said mold and the force in the opposite direction provided to said structure according to the profile and controls said mold driving unit to provide the demolding force to said mold and controls said force providing unit to provide the force in the opposite direction to said structure.

5. The imprint apparatus according to claim 3, further comprising:
a detection unit that detects the demolding force provided to said mold,
wherein said control unit controls said force providing unit to provide, to said structure, force in the opposite direction equivalent to the force generated in said structure according to the demolding force detected by said detection unit.

6. The imprint apparatus according to claim 2, wherein said stage base supports said structure through a second anti-vibration mount that reduces propagation of vibration.

* * * * *